United States Patent [19]

Harnden, Jr. et al.

[11] Patent Number: 4,755,706

[45] Date of Patent: Jul. 5, 1988

[54] PIEZOELECTRIC RELAYS IN SEALED ENCLOSURES

[75] Inventors: John D. Harnden, Jr., Schenectady; William P. Kornrumpf, Albany, both of N.Y.

[73] Assignee: General Electric Company, Fort Wayne, Ind.

[21] Appl. No.: 876,149

[22] Filed: Jun. 19, 1986

[51] Int. Cl.[4] .......... H01L 41/08

[52] U.S. Cl. .......... 310/332; 310/330; 200/181

[58] Field of Search .......... 310/330-332, 310/344, 348; 200/181

[56] References Cited

U.S. PATENT DOCUMENTS

| | | | |
|---|---|---|---|
| 3,359,435 | 12/1967 | Webb | 310/344 X |
| 3,970,880 | 7/1976 | Deutschmann et al. | 310/344 |
| 4,093,883 | 6/1978 | Yamamoto | 310/332 X |
| 4,405,875 | 9/1983 | Nagai | 310/344 |
| 4,461,968 | 7/1984 | Kolm et al. | 310/332 |
| 4,654,555 | 3/1987 | Ohba et al. | 310/332 |

FOREIGN PATENT DOCUMENTS

| | | | |
|---|---|---|---|
| 273157 | 7/1964 | Australia | 200/181 |
| 254343 | 9/1964 | Australia | 310/332 |
| 2537760 | 3/1977 | Fed. Rep. of Germany | 310/332 |
| 2749428 | 4/1979 | Fed. Rep. of Germany | 310/344 |
| 2852795 | 6/1979 | Fed. Rep. of Germany | 310/332 |
| 46-411 | 12/1967 | Japan | 310/332 |
| 1096824 | 12/1967 | United Kingdom | 200/181 |
| 2002955 | 2/1979 | United Kingdom | 310/344 |

OTHER PUBLICATIONS

Piezo Ceramic Devices, by Ruby, *Popular Science*, pp. 69-71, Jul. 1982.

*Primary Examiner*—Mark O. Budd
*Attorney, Agent, or Firm*—John M. Stoudt

[57] ABSTRACT

A piezoceramic relay is disclosed having a bimorph actuating member cantilever mounted within an enclosure of various forms and materials. The enclosures may be moisture-proof and/or hermetically sealed to maintain a vacuum or a protective gaseous atmosphere in which the relay contacts operate. The electrical terminations of the relay are brought out externally of the enclosure in a form compatible with a plug receptacle. To ensure precision contact gaps, removable spacers are positioned between the stationary and movable contacts during prepolarization of the bimorph member.

16 Claims, 5 Drawing Sheets

PIEZOELECTRIC RELAYS IN SEALED ENCLOSURES

The present invention relates to piezoceramic relays and particularly to techniques for mounting and packaging the various parts of a piezoceramic relays.

Electromagnetic relays are commonly used as switching components for controlling current flow in load circuits in response to control signals. Thus, such relays are well suited to serve as an interface between, for example, an electronic control circuit and a load circuit, wherein the former handles the low power control signals for selectively energizing the relay coil to appropriately position the relay contacts acting in the power circuit to switch relatively higher levels of power.

Electromagnetic relays do however have their drawbacks. Although they have been miniaturized as compared to earlier relay designs, their actuating power requirements are quite large in contrast to, for example, comparable, state of the art solid state power switches. Such relays are relatively complex and expensive to manufacture, for example, their coils typically require a large multitude of turns of very fine wire. The coil resistance, though low, nevertheless consumes some power with resulting generation of heat.

For a variety of reasons, including the fact that the wire insulation remains active with time and temperature variations, electromagnetic relays can not be readily, reliably packaged in hermetic or vacuum sealed enclosures to provide a vacuum environment or an ambient atmosphere of an inert gas, such as nitrogen and argon, or of a high dielectric strength gas, such as sulfur hexafluoride, in which the relay contacts can operate. As is well understood in the art, current commutation in a vacuum, inert gas or insulating gas environment suppresses arcing and thus prolongs contact life. Contact gaps can be reduced, and voltage withstand is dramatically increased. Increased contact resistance over time due to oxidation is avoided.

The various drawbacks of electromagnetic relays as power switching output devices, including those mentioned above, have prompted renewed interest in piezoelectric relays. Recent improvements in piezoceramic materials have enhanced their electromechanical efficiency for relay applications. Piezoelectric drive elements may be fabricated from a number of different polycrystalline ceramic materials such as barium titanate, lead zirconate titantate, lead metaniobate and the like which are precast, pressed or extruded into desired shapes, such as retangular-shaped plates, and then fired. Piezoelectric or piezoceramic relays require very low actuating current, dissipate minimal power to maintain an actuated state, and draw no current while in their quiescent state. The electrical characteristics of piezoceramic drive elements are basically capacitive in nature, and thus, in contrast to electromagnetic relays, are essentially immune to ambient electromagnetic fields and mutual flux coupling between adjacent relays. Piezoceramic relays can be designed in smaller physical sizes than comparably rated electromagnetic relays. Since piezoceramic relays utilize switch contacts in the manner of electromagnetic relays, contact separation introduces an air gap in the load circuit as is required for UL approval in most domestic, commercial, industrial and appliance applications. Closure of the relay contacts provides a non-rectifying, non-distorting current path of negligible resistance, and thus, in contrast to solid state power switches, virtually no losses or other deleterious effects are introduced into the load circuit.

A further advantage of piezoceramic relays over electromagnetic relays is that, while the latter can only be operated in air, applicants have determined that piezoceramic relays are quite conducive to being packaged in sealed, protective enclosures for operation in a vacuum or in inert or high dielectric strength gaseous atmospheres. Thus, in applicant's commonly assigned, copending application entitled "Advanced Piezoceramic Power Switching Devices Employing Gastight Enclosure and Method of Manufacture, Ser. No. 685,108, filed Dec. 21, 1984, the packaging of one or more bimorph relay actuators and associated contacts in gastight enclosures is disclosed.

It is accordingly, an object of the present invention to provide an improved piezoceramic relay.

An additional object is to provide an improved piezoceramic relay wherein the parts thereof are mounted and packaged in an efficient and reliable manner.

A further object is to provide a piezoceramic relay of the above-character wherein the relay parts are packaged in an enclosure of improved construction.

Another object is to provide a piezoceramic relay of the above-character wherein the relay enclosure is susceptible to being made moisture impervious.

A still further object is to provide a piezoceramic relay of the above-character wherein the relay enclosure may readily be hermetically sealed to contain a vacuum or a protective gaseous atmosphere.

Yet another object is to provide a piezoceramic relay of the above-character wherein the relay enclosure is constructed to mount the relay parts in precise positional relationship in a manner amenable to batch fabrication and mass production methods.

An additional object is to provide a method wherein the relay contact gaps of a piezoceramic relay of the above-character may be establish to precise, predetermined dimensions.

Another object of the invention will in part be obvious and in part appear hereinafter.

SUMMARY OF THE INVENTION

In accordance with the present invention, there is provided a piezoceramic relay comprising a bimorph actuating member which is cantilever mounted in a generally rectangular enclosure or case formed of a suitable material such as glass, ceramic, or plastic, Carried at the free end of the bimorph member is at least one and preferably a set of two movable relay contacts which are poised in gapped relation with a pair of stationary contacts precisely, positional mounted by the case. There is thus provided, in relay convention, a Form H contact arrangement wherein, with the bimorph member unenergized, the movable contacts are stationed in neutral, center "off" positions in spaced relation with their respectively associated fixed contacts. Upon selective energization of the bimorph member, it flexes in bender-like fashion to engage one or the other of the mating sets of fixed and movable contacts to route current through one or two load circuits wired therewith. Upon de-energization, the bimorph member returns to its center "off" position.

The invention can be embodied in various forms to provide a case that is moisture-proof or hermetically sealed to contain a vacuum or a protective gaseous atmosphere in which the relay contacts can operate. The invention is also directed to embodiments wherein the mounted end of the bimorph member extends externally of its case through a sealed opening therein to expose its various electrodes for engagement by contact elements of a plug receptacle. Conductor runs connected with the fixed and movable contacts and supported on the case interior surfaces or on unelectroded surfaces of the bimorph member are also brought out through sealed case feedthrough openings for engagement with other contact elements of the same plug recepacle.

To assure a reliable center "off" position and to achieve predetermined, preferably a uniform gap dimension between the mating fixed and movable contacts of each set, the gaps are precisely set during the manufacturing process by the inclusion of accurately dimensioned spacers in each contact gap. During pre-polarization, the bimorph member, is constrained by these spacers to assume a well defined neutral position with its movable contacts uniformly gapped relative to their associated fixed contacts. The spacers are then physically removed intact or formed of a material which can be dissolved by an appropriate solvent, etched away, or vaporized by a focused laser beam.

The invention accordingly comprises the features of construction, arrangements of parts and combinations of elements which will be exemplified in the constructions hereinafter set forth, and the scope of the invention will be indicated in the claims.

For a better understanding of the nature and objects of the present invention, reference should be had to the following detailed description taken in conjunction with the accompanying drawings, in which.

Figure 10:
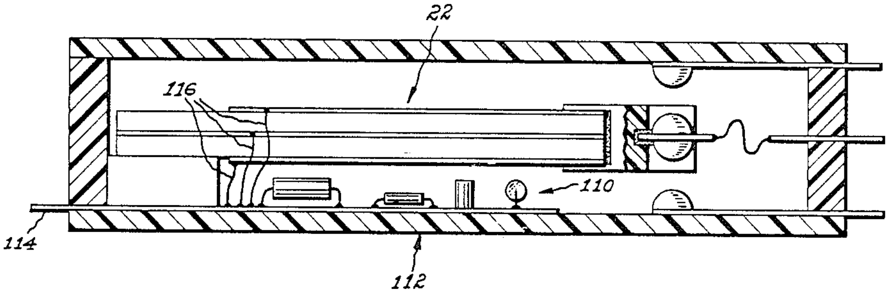
Figure 11:
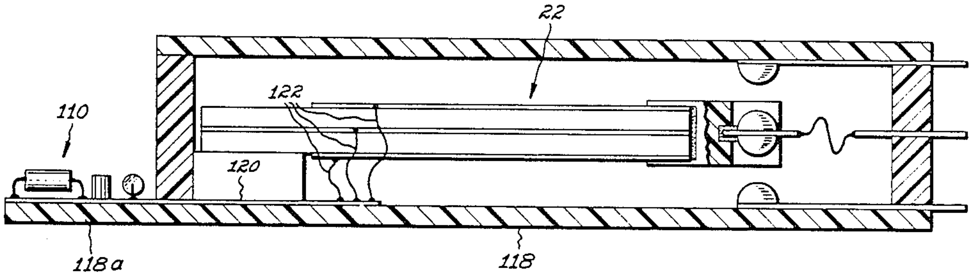

FIG. 10 is a longitudinal sectional view of a piezoceramic relay embodiment illustrating copackaging of the relay components and bimorph member energizing electronic integrated circuit components within a common case; and FIG. 11 is a longitudinal sectional view of a piezoceramic relay embodiment wherein the bimorph member energizing electronic integrated circuit components are mounted externally by an extension of the relay case.

Like reference numerals refer to corresponding parts throughout the several views of the drawings.

DETAILED DESCRIPTION

Figure 1:
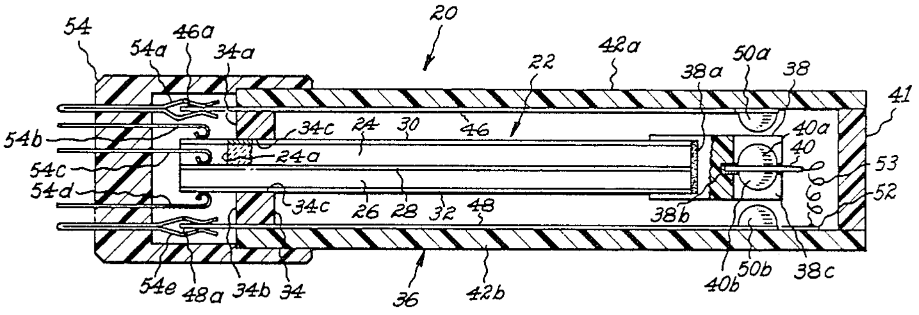
FIG. 1 is a longitudinal sectional view of a piezoceramic relay constructed in accordance with one embodiment of the invention.
Figure 2:
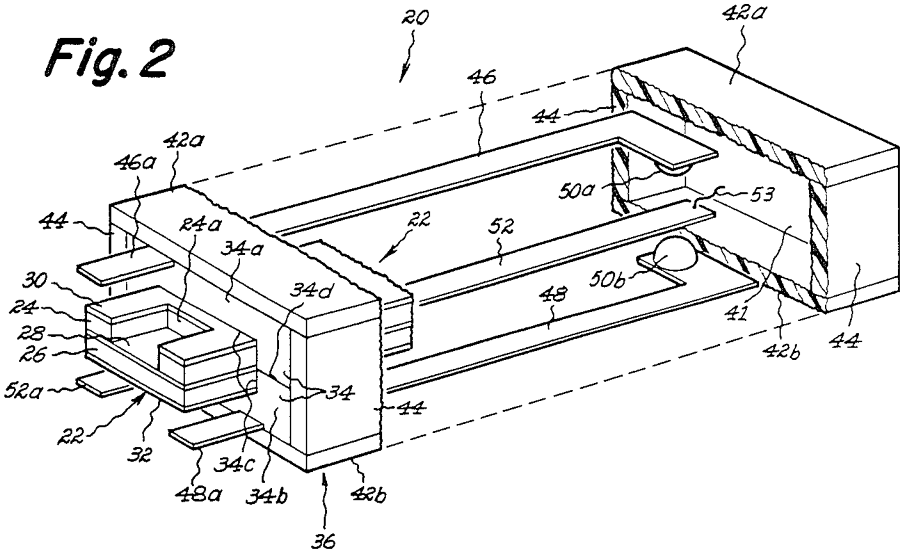
FIG. 2 is a perspective view of the piezoceramic relay of FIG. 1.

Referring first to FIGS. 1 and 2, a piezoceramic relay, generally indicated at 20, includes a bimorph actuating member, generally indicated at 22 and consisting of a pair of piezoceramic plates 24 and 26 bonded together in sandwich fashion with a common, intervening surface electrode 28. The exposed upper surface of plate 24 is coated with a conductive metal to provide an electrode 30, while the exposed lower surface of plate 26 is similarly electroded, as indicated at 32. The plates are formed of known piezoceramic materials such as lead zirconate titanate (PZT), lead metaniobate, and barium titanate, while the surface electrodes are provided by deposited coatings of a suitable metal, such as nickel, silver and the like. Recent piezoceramic material improvements have provided higher density PZT materials of long life and stability with enhanced power switching capabilities.

Bimorph member 22 is cantilever mounted adjacent one end by a wall 34 of an enclosure or case, generally indicated at 36. Affixed to the free end of member 22 is a contact carrier 38 which supports a pair of opposed movable contacts **40*a* and 40*b*. As seen in FIG. 1, contact carrier 38 is formed of a suitable, structurally rigid plastic with a transverse slot 38*a* at one end for accepting the free end of bimorph member 22. This assembly of the contact carrier to the bimorph member is sustained with a suitable adhesive such as epoxy cement. The other end of the contact carrier is formed with a transverse slot 38*b* for accepting a copper plate 40 with movable contacts 40*a* and 40*b* affixed in electrical connection to its opposed surfaces. The contact carrier is notched, as indicated at 38*c*, to provide clearance for the movable contacts. Plate 40 is likewise adhesively bonded in place. It is seen that contact carrier 38 is constructed to provide a low profile assembly of the movable contacts to the bimorph member and thus affords a minimum height dimension for case 36**.

Case 36, as seen in FIGS. 1 and 2, is constructed from, in addition to endwall 34, an opposed endwall 41, a top wall **42*a*, a bottom wall 42*b*, and a pair of sidewalls 44, all joined together to form a generally retangular, box-like enclosure. These case walls may be formed of glass, ceramics such as berylium oxide, alumina, steatite, or a high performance, engineered plastic such as ULTEM, a polyetherimide. ULTEM is a registered trademark of the General Electric Company. In the case of glass walls, they may be joined together with a glass frit to provide a moisture-proof and even a hermetic enclosure. Ceramic and ULTEM plastic walls may be joined with a variety of bonding agents or selectively copper plated and soldered together. Either approach is capable of providing a case 36** of sufficient hermeticity to sustain a vacuum or a protective gaseous atmosphere of inert gas such as dry nitrogen or a high strength dielectric gas such as sulfurhexafluoride.

As seen in FIG. 2, endwall 34 is formed in two parts **34*a* and 34*b* which are respectively provided with opposed notches 34*c* closely dimensioned to securely clamp bimorph member 22 between the wall parts when they are joined together along seam 34*d*. Preferably, the terminal portion of the bimorph member extends sealingly (hermetically) through and beyond endwall 34 to present its surface electrodes 28, 30 and 32 externally of case 36. Piezoceramic plate 24 is notched, as indicated at 24***a*, to expose electrode 28.

A conductor run or strip 46 is affixed to the inner surface of top wall 42, while a similar conductor run 48 is affixed to the inner surface of bottom wall 42*b*. Affixed to the inner end portion of conductor run 46 is a stationary contact 50*a* for disposal in gapped relation to movable contact 40*a*. A second stationary contact 50*b* is affixed to the inner end portion of conductor run 48 where it is positioned in gapped relation to movable contact 40*b*. The outer ends of these conductor runs exit case 36 at the seams between back wall 34 and the top and bottom walls to present terminal portions 46*a* and 48*a* externally of the case. A third conductor run 52 is affixed to the inner surface of bottom wall 42*b* and extends from a terminal portion 52*a* disposed externally of the case to an inner end terminating short of end wall 41 where the electrical connection with movable contact carrier plate 40 is effected via a flexible, flying lead 53. It will be appreciated that when the relay case is formed of ceramic walls, excellent heat sinking of the relay contacts is afforded. Normally, electromagnetic relays do not offer any convenient way of heat sinking its contacts for increased life and load rating. This results from the conflicting requirements of electrical isolation between the contacts and the desire for a high thermal conductivity contact mounting part which is typically formed of plastic, a poor thermal conductor.

From the foregoing description, it is seen that the electrodes of bimorph member 22 and the terminal portions of the various conductor runs are made available beyond endwall 34 in positions conveniently accessible to contact elements of a plug receptacle, indicated at 54. Thus, as seen in FIG. 1, contact element 54*a* can make electrical connection with terminal portion 46*a* of conductor run 46, contact element 54*b* with surface electrode 30, contact element 54*c* with surface electrode 28 made accessible via notch 24*a*, contact element 54*d* with surface electrode 32, and contact element 54*e* with terminal portion 48*a* of conductor run 48. While blocked from view in FIG. 1, a separate contact element of plug receptacle engages terminal portion 52*a* of conductor run 52. Thus, the piezoceramic relay construction seen in FIGS. 1 and 2 provides for convenient plug-in installation in complex electrical equipment, such as panelboards, printed circuit boards and the like.

For a detailed description of the mechanisms involved in the electrical actuation of bimorph member 22 to achieve a desired relay action, reference can be had to applicants' commonly assigned, copending application entitled "Improved Piezoelectric Ceramic Switching Devices and Systems and Methods of Making Same; Ser. No. 685,109, filed Dec. 21, 1984. For purposes of the present description, it is believed sufficient to state that, assuming, for example, piezoceramic plates 24 and 26 to have been prepolarized during fabrication by the application of a relatively negative potential to common electrode 28 and equal, relatively positive potentials to electrodes 30 and 32. When voltages of the same relative polarities are applied across plate 24, this plate expands in the direction perpendicular to the plane of its surface electrodes (increases in thickness) and contracts in the direction parallel to the planes of its electrodes (decreases in length from its free end to its clamped end). As a consequence, bimorph member deflects upwardly to bring movable contact 40*a* into engagement with fixed contact 40*a*. On the other hand, when an electric field is developed across plate 26 poled in the same direction as it prepolarized polarity, this plate undergoes the same distortions causing bimorph member 22 to deflect downwardly to engage movable contact 40*b* with fixed contact 50*b*. Contact engagement is sustained as long as the requisite electrode potentials are maintained. Upon removal of the actuating field, the bimorph member reverts to its neutral, center "off" position illustrated in FIG. 1. This inherent neutral position is a fail-safe condition which is difficult to achieve in electromagnetic relays, requiring bias magnets or a complex mechanical mechanism.

Figure 3:
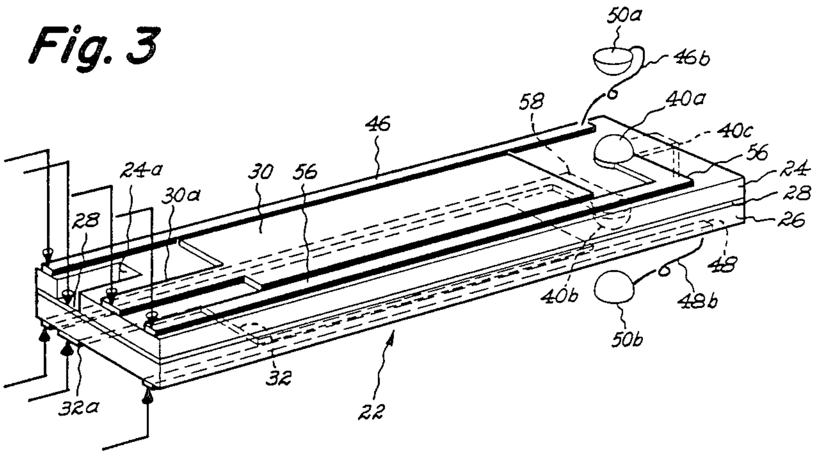
FIG. 3 is a perspective view of a relay bimorph member illustrating an alternative arrangement for bringing out electrical terminations for the various relay contacts.

FIG. 3 illustrates an alternative approach to bringing circuit connections through case endwall 34 (FIG. 2) to movable contacts 40*a*, 40*b* and fixed contacts 50*a*, 50*b*. Instead of affixing the current feeding conductor runs to the top and bottom case walls, they are applied to unelectroded surfaces of bimorph member 22. Thus, as seen in FIG. 3, surface electrode 30 is reduced in size to make available marginal surfaces portions of piezoceramic plate 24 for carrying conductor run 46 to feed fixed contact 50*a* via a flying lead 46*b*; this fixed contact being appropriately located and affixed to the inner surface of case top wall 42*a* (FIG. 1). Surface electrode 32 is likewise reduced in size to make available electrode-free surface portions of piezoceramic plate 26 for carrying conductor run 48 to feed fixed contact 50*b* via flying lead 48*b*. Contact 50*b* is similarly affixed to the inner surface of case bottom wall 42*b*.

Also shown in FIG. 3 is the alternative approach of mounting movable contact 40*a* and 40*b* to unelectroded surface portions of plates 24 and 26, respectively, rather than via contact carrier 38 of FIG. 1. To feed movable contact 40*a*, a conductor run 56 is applied to the unelectroded marginal surface portion of plate 24, while movable contact 40*b* is feed by as conductor run 58 applied to the unelectroded marginal surface portion of plate 26. It is seen, in contrast to the contact arrangement of FIG. 1, that the two sets of fixed and movable contacts seen in FIG. 3 may be adapted to operate in complete separate circuits since the two movable contacts are not electrically common. However, it will be appreciated that the movable contacts may be shorted together by a conductive, U-shaped clip, indicated in phantom at 40*c*, in which case one of the conductor runs 56 or 58 can be eliminated. Also to be understood is that bimorph member 22 in FIG. 2 may be equipped with movable contact carrier 38 of FIG. 1, in which case a jumper (now shown) would be used to connect conductor run 56 or 58 to contact carrier plate 40.

FIG. 3 further illustrates the modification of recessing the surface electrodes 30 and 32 back from the terminal end of the bimorph member, such that only electrical termination portions thereof, indicated at 30*a* and 32*a*, are carried through case end wall 34. This has the advantage of rendering the portions of the piezoceramic plates passing through the case end wall substantially unpoled and electrically neutral. Thus, these pass-through portions of the plates, by design, remain relatively physically inactive during relay operation, and consequently the integrity of the cantilever mounting of the bimorph member is not degraded over time. That is, there is no physical motion of this portion of the bimorph member tending to induce fracture or cracking of the case endwall.

The arrows illustrated in FIG. 3 diagrammatically represent receptacle contact elements which are adapted to make electrical contact with electrode terminal portions 30*a* and 32*a*, electrode 28, and the terminal portions of the various conductor runs.

Figure 4:
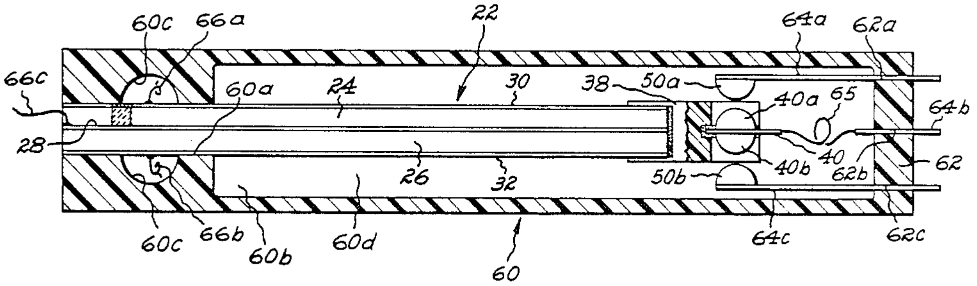
FIG. 4 is a side elevational view of a piezoceramic relay packaged in a molded plastic case.

FIG. 4 illustrates an alternative packaging approach wherein the body, generally indicated at 60, of a relay enclosure is configured such as to be capable of being injection molded in one piece of a suitable, highly stable engineered plastic, such as polyetherimide (ULTEM). Thus, body 60 is formed with a carefully dimensioned blind slot 60*a* in which one end of bimorph member 22 is snugly received and bonded in place to effect the requisite cantilever mounting thereof. Slot 60*a* opens into a large cavity 60*b* providing adequate space for the bimorph member to flex during relay operation. This cavity is closed off beyond the free end of the bimorph member by an end wall 62 in which are formed three blind, narrow slots 62*a*, 62*b* and 62*c*. Fitted into slot 62*a* is a relatively rigid copper strap 64*a* which serves to mount at its inner end fixed contact 50*a*. Slot 62*c* receives a like copper strap 64*c* which serves to mount fixed contact 50*b*. Received in slot 62*b* is a copper strap 64*b* which is electrically connected via a flying lead 65 to conductive carrier plate 40 to which movable contacts 40*a* and 40*b* are affixed in opposed relation. As described in FIG. 1, this carrier plate is supported by a contact carrier 38 which, in turn is mounted to the free end of bimorph member 22 with the fixed and movable contacts in appropriately gapped relation.

Still referring to FIG. 4, the side walls of slot 60*a* are formed with opposed concavities 60*c* to affor access to surface electrodes 30 and 32 for the connections thereto of lead-in conductors 66*a* and 66*b*. These conductors may be brought out via through sealable holes (not shown) formed in the closed side 60*d* of body which concavities 60*c* are reduced down to. Alternatively, these conductors may be brought out through the open side which may be ultimately, sealingly closed off by a suitable cover (not shown). Connection to common electrode 28 is made by a lead 66*c* as illustrated.

Figure 5:
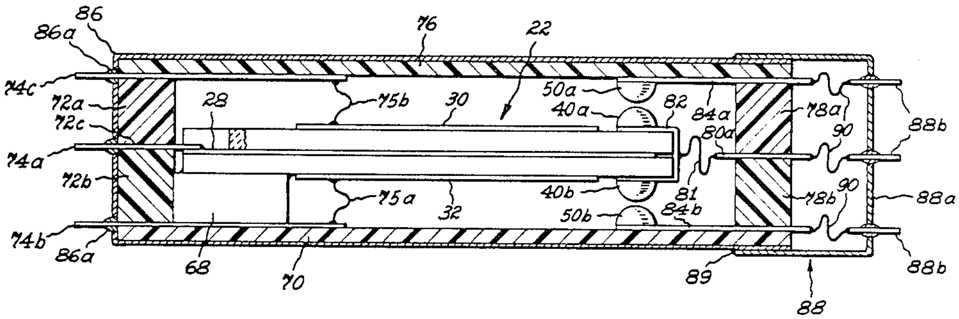
FIG. 5 is a longitudinal sectional view of a piezoceramic relay packaged in a shielded, hermetically sealed case.

FIG. 5 illustrates yet another hermetic packaging approach wherein one end of bimorph member 22 is adhesively bonded or soldered to a pedestal 68 which, in turn, is affixed to the case bottom wall 70 to effect the requisite cantilevered mounting. The left endwall is comprised of two sections 72*a* and 72*b* bonded together along a seam 72*c* in which the entry of a lead-in conductor 74*a*, connected with common electrode 28, is sealingly accommodated. The bonding seam between end wall section 72*b* and bottom wall 70 accommodates a lead-in conductor 74*b*, which is connected via a flying lead 75*a* to surface electrode 32. Similarly, the bonding seam between end wall section 72*a* and case top wall 76 sealingly admits lead-in conductor 74*c*, which is connected to surface conductor 30 via flying lead 75*b*.

The opposite end wall is similarly comprised of two sections 78*a* and 78*b*, with the seam therebetween sealingly admitting a lead-in conductor 80*a*, which is connected via a flying lead 81 to a U-shaped copper clip 82 affixed on the free end of bimorph member 22. Movable contacts 40*a* and 40*b* are affixed in electrical connection to clip 82. As illustrated, electrical clearance is provide between this clip and the bimorph electrodes 28, 30 and 32. The seam between end wall section 78*a* and top wall 76 sealing admits a conductive strap 84*a* which mounts at its inner end stationary contact 50*a* in appropriately gapped relation with movable contact 40*a*. Similarly, the seam between end wall section 78*b* and bottom wall 70 accommodates a strap 84*b* to which stationary contact 50*b* is mounted in gapped relation with movable contact 40*b*.

The case walls, which may be formed of a suitable engineered plastic such as polyetherimide (ULTEM), are coated with a layer of metal, such as copper 86, to provide shielding against the emission of undesired electromagnetic interference waves produced by the commutation of load currents during relay operation. In order that this shielding layer not short out the lead-in conductors, a suitable isolating material, such as a bead 86*a* of polyimide silane, is applied to these conductors at their points of exit from the case.

FIG. 5 also illustrates that a hermetic header 88 may be applied to the relay case to insure that the presence of the various lead-in conductors does not jeopardize the hermeticity of the relay case. This header may take the form of a metallic boot 88*a* which is fitted on the end of the relay case and sealed in place by a continuous bead of solder 89. Leads 88*b* admitted through hermetically sealed openings in the closed end of the boot may then be connected by jumpers 90 to the exposed ends of the lead-in conductors penetrating the relay case.

Figure 6:
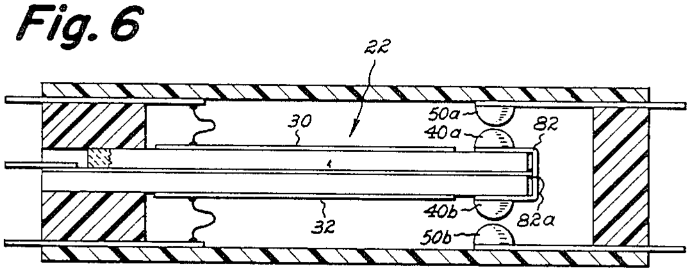
FIG. 6 is a longitudinal sectional view of a piezoceramic relay illustrating an alternative component mounting and packaging approach.

In FIG. 6, the bimorph member 22 is cantilever mounted in the case end wall in the manner described in FIGS. 1 and 2. As shown, surface electrodes 30 and 32 are terminated short of this end wall, such that the end section of the bimorph member clamped therein is relatively physically inactive during relay operation. Surface electrodes 30 and 32 are illustrated as being brought out electrically via flying leads and lead-in conductors in the manner described in FIG. 5. The same is true for stationary contacts 50*a* and 50*b*. Movable contacts 40*a* and 40*b* are affixed to the free end of bimorph member 22 via metal clap 82, again in the manner of FIG. 5.

In certain applications, operation of the bimorph actuating circuit and the power circuits from a common reference potential, such as ground, is permissable. In such case, movable contacts 40*a*, 40*b* and the common electrode may be connected in common, as indicated at 82*a* in FIG. 6. Thus, the common electrode can doubly serve as the lead-in conductor for the movable contacts, thus eliminating one electrical feedthrough penetrating the relay case and the need for a flying lead connected with the movable contacts.

Figure 7:
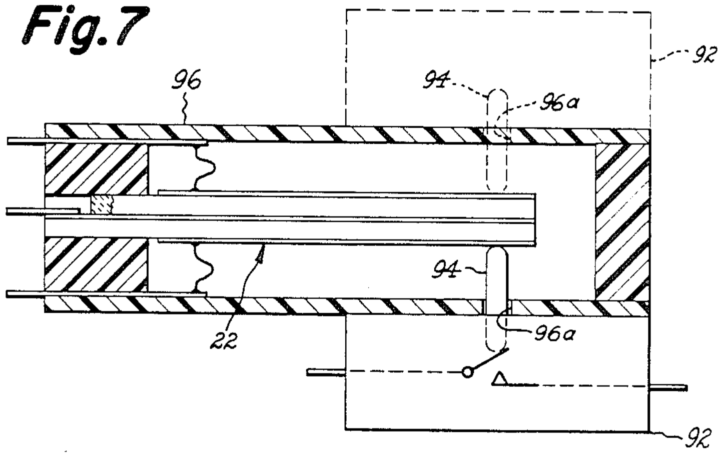
FIG. 7 is a longitudinal sectional view of a piezoceramic relay embodiment wherein a bimorph member actuates external switch contacts.

FIG. 7 illustrates that bimorph member 22 need not carry switching contacts, but instead may be adapted to actuate an external switch or switches 92 via a pushrod(s) 94 penetrating the bimorph mounting enclosure 96 by way of openings 96*a*. Switches 92 may be bistable switches, in which case only momentary actuation of the bimorph member is necessary to change the switch condition. Alternatively, the actuated switch condition may be sustained by maintaining the electric field across one of the piezoceramic plates; a situation which involves minimal power consumption.

Figure 8:
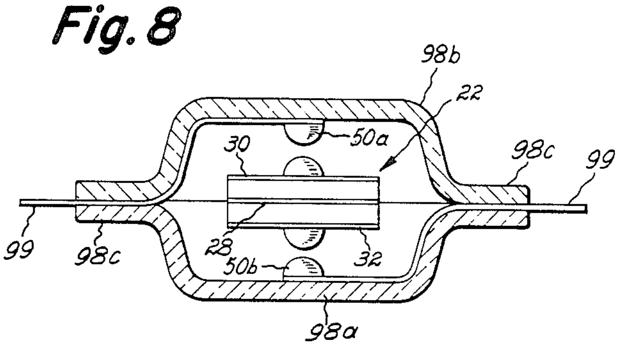
FIG. 8 is a transverse sectional view of a piezoceramic relay embodiment utilizing a hermetically sealed sag glass case.

In FIG. 8, bimorph member 22 is shown packaged in a sag glass case, consisting of a base 98*a* and a cover 98*b* sealed together along their flanged edges 98*c* by suitable means, such as a glass frit seal. As is well understood in the art, these glass case members are formed by heating a glass plate disposed over a concave mold cavity, causing the medial portion of the plate to sag downwardly into conformity with the contour of the mold cavity. Lead-in conductors 99, on which the stationary contacts 50*a* and 50*b* are affixed, are conformed to the case contour and brought out through the seam between the base and cover flanges 98c. The glass frit seal will readily accept the lead-in conductor thickness while perfecting the case hermetic seal. It will be appreciated that the base 98a and cover 98b are formed with opposed notches (not shown) analogous to notches 34c in FIGS. 1 and 2, in which one end of the bimorph member is received and sealed in place by glass frit, pursuant to effecting its cantilevered mounting.

Figure 9:
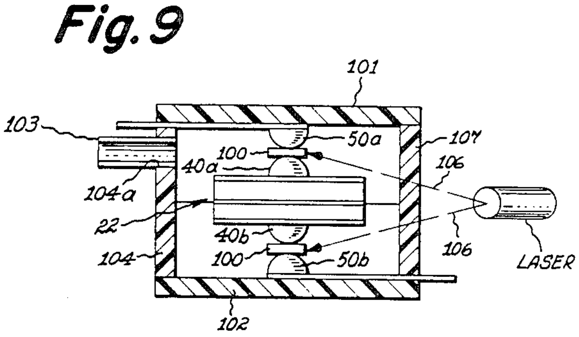
FIG. 9 is a transverse sectional view illustrating the utilization of removable spacers to establish the bimorph member center "off", neutral position and incidentally to set the relay contact gaps.

In the various packaging approaches described above, it is preferred that the bimorph member be prepolarized in situ, i.e., after the relay has been completely assembled. The temperature of the bimorph member is raised to just above the Curie temperature of the piezoceramic plates and then lowered to just below this Curie temperature while the requisite prepolarizing potentials are applied to surface electrodes 28, 30 and 32. With the new high density PZT materials, bimorph prepolarization can be accomplished at room temperature and without the bimorph member having to be immersed in an insulating oil bath. As described in the above-cited copending application, Ser. No. 685,108, during this prepolarizing procedure, it is desirable to appropriately adjust the prepolarizing potentials separately applied across the piezoceramic plate elements in order to center the free end of the bimorph member between the fixed contacts. To simplify this centering procedure, in accordance with the present invention, a spacer 100 is positioned between each set of fixed and movable contacts, as seen in FIG. 9. The prepolarizing step is then performed with these spacers in place. By taking into account the inside dimension between the top wall 101 and the bottom wall 102 of the relay case, the thickness of bimorph member 22 at its free end, and the heights of the fixed contacts 50a, 50b and movable contacts 40a, 40b, these spacers can be accurately dimensioned in thickness to take up the remaining available space and thus establish a uniform gap dimension and incidentially the desired center positioning of the bimorph free end in its neutral state.

Upon completion of the prepolarizing step, spacers 100 may be removed from the case utilizing a suitable tool (not shown) introduced through a nipple 103 sealed in an opening 104a formed in case side wall 104. Alternatively, the spacers may be dissolved utilizing an appropriate solvent introduced and subsequently removed via nipple 103. An appropriate etchant could also be utilized to eliminate the spacers. For example, a water soluble alumina is available from TAFA Inc. of Concord, New Hampshire. This being accompolished, the relay is baked out at temperatures sufficiently low as not to damage the piezoceramic plate elements, and the case is evacuated via nipple 103. If desired, the case can be back filled with an inert or high dielectric strength gas. Nipple 103 is then pinched off to hold the vacuum or protective gas atmosphere within the hermetic relay case. Alternatively, the spacers may simply be physically removed from the contact gaps and left in the case to serve as a getter.

Alternatively, the relay case may be hermetically sealed after bakeout and evacuation with spacers 100 left in place. A focused laser beam 106 of appropriated wavelength is then directed through transparent sidewall 107 to vaporize the spacers 100. The spacer material is selected such that the condensed residue thereof will not be harmful to the relay parts. In fact, the vaporized spacers may be at least in part formed of a gettering material such as barium which would serve to absorb any outgases emitted by the case material over time.

FIG. 10 illustrates a packaging approach wherein integrated circuitry, generally indicated at 110, appropriate for actuating bimorph member 22, is copackaged with the relay parts within hermetic case 112. If the case is backfilled with an inert gas, e.g., dry nitrogen, the integrated circuit chips need not be individually packaged or conformal coated. Applicants' entitled "Piezoelectric Relay Switching Circuit", Ser. No. 811,782, filed Dec. 20, 1985, discloses integrated circuitry appropriate for this purpose. The integrated circuitry is powered via lead-in conductors, commonly indicated at 114, which are introduced into the interior of case 112. Flying leads 116 connect the integrated circuitry to the surface electrodes 28, 30 and 32 of bimorph member 22.

Rather than being located within the case interior, the integrated circuitry 110 may be copackaged externally of the case on an exterior surface thereof, such as an extension 118a of the case bottom wall 118, as illustrated in FIG. 11. This circuitry is connected to the bimorph electrode via lead-in conductors 120 and flying leads 122. By virtue of the close proximity of the integrated circuitry to the bimorph member, the interconnecting leads can be quite short, thus minimizing stray impedances. Inductive and capacitive coupling of noise into the integrated circuitry is also minimized for the same reason.

While the relay embodiments disclosed herein are equipped with two sets of movable and fixed contacts certain relay applications may call for only a single set. Also, it will be appreciated that, as disclosed in the above-cited copending application Ser. No. 811,782, each fixed contact may be replaced by a closely spaced, side-by-side, pair of fixed contacts which are bridged by a movable contact in the form of shorting bar carried at the free end of the bimorph member to complete a power circuit. Using this approach avoids the need for a flying lead to feed bimorph mounted movable contacts.

It will thus be seen that the objects set forth above, including those made apparent from the preceding description, are efficiently attained, and, since certain changes may be made in the above constructions without departing from the scope of the invention, it is intended that all matter contained in the above description or shown in the accompanying drawings shall be interpreted as illustrative and not in a limiting sense.

Having described the invention, what is claimed as new and desired to secure by Letter Patent is:

1. A piezoceramic relay comprising, in combination:

a bimorph member including first and second piezoceramic plate elements bonded together in sandwich fashion with at least one common intervening first electrode, a second electrode affixed to the outer surface of said first plate element, and a third electrode affixed to the outer surface of said second plate element, said plate elements of said bimorph member being selectively prepolarized in a parallel configuration so that when an electric field is selectively applied across either one of said plate elements in the same direction as its prepolarized polarity, said plate element contracts in a direction parallel to the plane of said electrodes causing said bimorph member to bend in the direction of said selectively energized plate element;

an enclosure including conjoined, opposed first and second endwalls, and essentially planar, opposed top and bottom walls, said bimorph member mounted adjacent its one end in cantilever fashion by said first endwall with the other free end thereof terminating short of said second endwall and disposed in uniform spaced relation between said top and bottom walls;

an electrical insulating contact carrier conjointly movable with said bimorph member upon the bending thereof and including a pair of opposite end portions, a pair of transverse slots in said opposite end portions, respectively, the other free end of said bimorph member being received in one of said transverse slots and retained against displacement therefrom, an electrical conductive plate received in the other of said transverse slots and retained against displacement therefrom, and at least one movable contact carried on said electrical conductive plate;

at least one stationary, fixed contact mounted by one of said top wall, bottom wall and second endwall in opposed, normally gapped relation with said at least one movable contact;

and separate conductor means sealingly introduced into said enclosure for connecting said contacts into an external power circuit.

2. The piezoceramic relay defined in claim 1, wherein said enclosure is heremetically sealed to maintain a vacuum.

3. The piezoceramic relay defined in claim 1 wherein said enclosure is hermetically sealed to contain a protective gaseous atmosphere.

4. The piezoceramic relay defined in claim 1, wherein said enclosure is an essentially hermetic enclosure with said walls thereof comprised of a material selected from the group consisting of glass, ceramic and plastic materials.

5. The piezoceramic relay defined in claim 1, wherein said endwalls, and said top and bottom walls are integrally formed of a molded plastic material.

6. The piezoceramic relay defined in claim 1, wherein said one end of said bimorph member is clamped between mating sections of said first endwall.

7. The piezoceramic relay defined in claim 6, wherein said one end of said bimorph member extends sealingly through said first endwall between said first and second sections thereof, whereby to expose portions of said first, second and third electrodes externally of said enclosure for separate engagement by individual contact elements of a plug receptacle pursuant to connecting said first, second and third electrodes to an external source of actuating voltages of said bimorph member.

8. The piezoceramic relay defined in claim 7, which includes first and second movable contacts carried in opposed relation by said electrical conductive plate, and first and second stationary contacts separately mounted by said top and bottom walls in respectively gapped relation to said first and second movable contacts, said conductor means including separate conductor runs affixed to said top and bottom walls and separately electrically connected at their inner ends with said stationary and movable contacts, the outer ends of said conductor runs projecting sealingly through said first endwall for separate engagement by other individual contact elements of the plug receptacle pursuant to connecting said contacts into separate external power circuits.

9. The piezoceramic relay defined in claim 7, which includes first and second movable contacts carried in opposed relation by said electrical conductive plate, and first and second stationary contacts separately mounted by said top and bottom walls in respectively gapped relation with said first and second movable contacts, said conductor means including separate conductor runs affixed to electrode-free marginal surface portions of at least one of said first and second piezoceramic plate elements, the inner ends of two of said conductor runs separately electrically connected to said first and second stationary contact by flexible leads, and the outer ends of said conductor runs projecting sealingly through said first endwall for separate engagement by other individual contact elements of the plug receptacle pursuant to connecting said contacts into separate external power circuits.

10. The piezoceramic relay defined in claim 5, wherein said second endwall is molded with slots therein, said conductor means being separately received in said slots, one of said conductor means mounting said stationary contact adjacent its inner end, and another of said conductor means connected adjacent its inner end to said movable contact by a flexible lead.

11. The piezoceramic relay defined in claim 1, wherein said enclosure is coated over its exterior surfaces with a layer of electrically conductive material.

12. The piezoceramic relay defined in claim 1, wherein said enclosure walls are hermetically sealed along their junctions with each other, said relay further including at least one hermetic header sealingly affixed to said enclosure and including separate feedthrough leads sealingly penetrating said header and individually electrically connected with said conductor means at points intermediate said enclosure and said header.

13. The piezoceramic relay defined in claim 1, which further includes integrated circuitry situated within said enclosure and electrically connected with said first, second and third electrodes.

14. The piezoceramic relay defined in claim 1, which further includes integrated circuitry mounted on an exterior surface of one of said enclosure walls, said circuitry electrically connected with said first, second and third electrodes by separate leads introduced into said enclosure.

15. The piezoceramic relay defined in claim 6, wherein the portion of said one end of said bimorph member clamped between said mating sections of said first endwall is devoid of said second and third electrodes.

16. The piezoceramic relay defined in claim 1, wherein said one enclosure wall mounting said stationary contact is formed of a ceramic material of high thermal conductivity, whereby to provide an effective heat sink for said stationary contact.

* * * * *